(12) United States Patent
Ravkin et al.

(10) Patent No.: US 7,153,400 B2
(45) Date of Patent: Dec. 26, 2006

(54) APPARATUS AND METHOD FOR DEPOSITING AND PLANARIZING THIN FILMS OF SEMICONDUCTOR WAFERS

(75) Inventors: Mike Ravkin, Sunnyvale, CA (US); John Boyd, Atascadero, CA (US); Yezdi N. Dordi, Palo Alto, CA (US); Fred C. Redeker, Fremont, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 354 days.

(21) Appl. No.: 10/607,611

(22) Filed: Jun. 27, 2003

(65) Prior Publication Data

US 2004/0178060 A1 Sep. 16, 2004

Related U.S. Application Data

(63) Continuation-in-part of application No. 10/330,843, filed on Dec. 24, 2002, which is a continuation-in-part of application No. 10/261,839, filed on Sep. 30, 2002.

(51) Int. Cl.
*C25D 17/02* (2006.01)
*C25D 7/12* (2006.01)
*C25D 5/04* (2006.01)
*C25D 5/06* (2006.01)

(52) U.S. Cl. .............. 204/224 R; 204/275.1; 204/280; 204/297.01; 205/147

(58) Field of Classification Search .......... None
See application file for complete search history.

(56) References Cited

U.S. PATENT DOCUMENTS

| | | | |
|---|---|---|---|
| 3,953,265 A | 4/1976 | Hood | |
| 4,086,870 A | 5/1978 | Canavello et al. | |
| 4,367,123 A * | 1/1983 | Beck | 205/129 |
| 4,444,492 A | 4/1984 | Lee | |
| 4,838,289 A | 6/1989 | Kottman et al. | |
| 5,102,494 A | 4/1992 | Harvey et al. | |
| 5,180,431 A | 1/1993 | Sugimoto et al. | |
| 5,271,774 A | 12/1993 | Leenaars et al. | |
| 5,294,257 A | 3/1994 | Kelly et al. | |
| 5,343,234 A | 8/1994 | Kuehnle | |
| 5,361,449 A | 11/1994 | Akimoto | |
| 5,472,502 A | 12/1995 | Batchelder | |
| 5,558,111 A | 9/1996 | Lofaro | |
| 5,601,655 A | 2/1997 | Bok et al. | |

(Continued)

FOREIGN PATENT DOCUMENTS

| | | |
|---|---|---|
| EP | 0 905 746 A1 | 3/1999 |
| EP | 0 905 747 A1 | 3/1999 |
| EP | 1 489 461 A1 | 12/2004 |
| EP | 1 489 462 A2 | 12/2004 |
| JP | 58-37190 | 3/1983 |

(Continued)

OTHER PUBLICATIONS

J.A. Britten, "A moving-zone Marangoni drying process for critical cleaning and wet processing," Oct. 1997, *Solid State Technology*.

(Continued)

*Primary Examiner*—Harry D Wilkins, III
(74) *Attorney, Agent, or Firm*—Martine Penilla & Gencarella, LLP (57) ABSTRACT

An electroplating apparatus for depositing a metallic layer on a surface of a wafer is provided. In one example, a proximity head capable of being electrically charged as an anode is placed in close proximity to the surface of the wafer. A plating fluid is provided between the wafer and the proximity head to create localized metallic plating.

12 Claims, 10 Drawing Sheets

U.S. PATENT DOCUMENTS

| | | | |
|---|---|---|---|
| 5,660,642 A | 8/1997 | Britten | |
| 5,705,223 A | 1/1998 | Bunkofske | |
| 5,709,757 A | 1/1998 | Hatano et al. | |
| 5,807,522 A | 9/1998 | Brown et al. | |
| 5,830,334 A | 11/1998 | Kobayashi | 204/224 R |
| 5,882,433 A | 3/1999 | Ueno | |
| 5,893,004 A | 4/1999 | Yamamura | |
| 5,945,351 A | 8/1999 | Mathuni | |
| 5,975,098 A | 11/1999 | Yoshitani et al. | |
| 5,989,478 A | 11/1999 | Ouellette et al. | |
| 5,997,653 A | 12/1999 | Yamasaka | |
| 6,086,454 A | 7/2000 | Watanabe et al. | |
| 6,092,937 A | 7/2000 | Snodgrass et al. | |
| 6,103,636 A | 8/2000 | Zahorik et al. | |
| 6,108,932 A | 8/2000 | Chai | |
| 6,132,586 A | 10/2000 | Adams et al. | 205/123 |
| 6,214,513 B1 | 4/2001 | Cai et al. | |
| 6,230,722 B1 | 5/2001 | Mitsumori et al. | |
| 6,341,998 B1 | 1/2002 | Zhang | 451/41 |
| 6,391,166 B1 | 5/2002 | Wang | 204/224 R |
| 6,398,975 B1 | 6/2002 | Mertens et al. | |
| 6,417,117 B1 | 7/2002 | Davis | |
| 6,433,541 B1 * | 8/2002 | Lehman et al. | 324/230 |
| 6,474,786 B1 | 11/2002 | Percin et al. | |
| 6,488,040 B1 * | 12/2002 | de Larios et al. | 134/95.2 |
| 6,491,764 B1 * | 12/2002 | Mertens et al. | 134/36 |
| 6,495,005 B1 * | 12/2002 | Flake et al. | 204/224 R |
| 6,514,570 B1 | 2/2003 | Matsuyama et al. | |
| 6,530,823 B1 | 3/2003 | Ahmadi et al. | |
| 6,531,206 B1 | 3/2003 | Johnston et al. | |
| 6,550,988 B1 | 4/2003 | Sugimoto et al. | |
| 6,555,017 B1 | 4/2003 | Rushford et al. | |
| 6,616,772 B1 | 9/2003 | De Larios et al. | |
| 6,689,323 B1 | 2/2004 | Fisher et al. | |
| 6,764,720 B1 | 7/2004 | Pui et al. | |
| 6,799,584 B1 | 10/2004 | Yogev et al. | |
| 6,851,435 B1 | 2/2005 | Mertens et al. | |
| 6,854,473 B1 | 2/2005 | Hanson et al. | |
| 6,954,993 B1 | 10/2005 | Smith et al. | |
| 6,988,326 B1 | 1/2006 | O'Donnell et al. | |
| 6,988,327 B1 | 1/2006 | Garcia et al. | |
| 7,000,622 B1 | 2/2006 | Woods et al. | |
| 7,069,937 B1 | 7/2006 | Garcia et al. | |
| 2002/0121290 A1 | 9/2002 | Tang et al. | |
| 2003/0091754 A1 | 5/2003 | Chihani et al. | |
| 2003/0092264 A1 | 5/2003 | Shinji et al. | |
| 2004/0060573 A1 | 4/2004 | Woods | |
| 2004/0069319 A1 | 4/2004 | Boyd et al. | |
| 2004/0069329 A1 | 4/2004 | de Larios et al. | |
| 2004/0136494 A1 | 7/2004 | Lof et al. | |
| 2004/0178060 A1 | 9/2004 | Ravkin et al. | |
| 2004/0182422 A1 | 9/2004 | Boyd et al. | |
| 2005/0132515 A1 | 6/2005 | Boyd et al. | |
| 2005/0139318 A1 | 6/2005 | Woods et al. | |
| 2005/0145265 A1 | 7/2005 | Ravkin et al. | |
| 2005/0145267 A1 | 7/2005 | Korolik et al. | |
| 2005/0145268 A1 | 7/2005 | Woods | |
| 2005/0148197 A1 | 7/2005 | Woods et al. | |
| 2005/0217703 A1 | 10/2005 | O'Donnell | |
| 2006/0064895 A1 | 3/2006 | Garcia et al. | |

FOREIGN PATENT DOCUMENTS

| | | |
|---|---|---|
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| JP | 2003-151948 | 5/2003 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

\* cited by examiner

FIG. 4

APPARATUS AND METHOD FOR DEPOSITING AND PLANARIZING THIN FILMS OF SEMICONDUCTOR WAFERS

CROSS REFERENCE TO RELATED APPLICATION

This application is a continuation-in-part and claims 35 U.S.C. § 120 priority from U.S. patent application Ser. No. 10/330,843 filed on Dec. 24, 2002 and entitled "Meniscus, Vacuum, IPA Vapor, Drying Manifold," which is a continuation-in-part of co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in their entirety.

BACKGROUND OF THE INVENTION

1. Field of the Invention

The present invention relates to semiconductor wafer deposition and planarization and, more particularly, to apparatuses and techniques for more effectively depositing thin films using localized deposition and for enabling localized planarization.

2. Description of the Related Art

Electroplating is a well-established deposition technology. In the semiconductor fabrication arts, electroplating is typically performed in a single-wafer processor, with the wafer immersed in an electrolyte. During electroplating, the wafer is typically held in a wafer holder, at a negative, or ground potential, with respect to a positively charged plate (also immersed in the electrolyte) which acts as an anode. To form a copper layer, for example, the electrolyte is typically between about 0.3M and about 0.85M $CuSO_4$, pH between about 0 and about 2 (adjusted by H2SO4), with trace levels (in ppm concentrations) of proprietary organic additives as well as $Cl^-$ to enhance the deposit quality. During the plating process the wafer is typically rotated to facilitate uniform plating. After a sufficient film thickness has been achieved during the plating process, the wafer is moved from the plating chamber to another chamber where it is rinsed in de-ionized (DI) water, to remove residual electrolyte from the wafer surface. Next the wafer is subjected to additional wet processing, to remove unwanted copper from the backside and bevel edge, and then another DI water rinse removes wet processing chemical residues. Then the wafer is dried and annealed before it is ready for the chemical mechanical planarization (CMP) operation.

Unlike vacuum processing of wafers, each "wet" processing step during wafer processing today is followed by an overhead step of a DI water rinse. Due to electrolyte dilution concerns and increased hardware design complexity, DI water rinsing is typically not done within the plating chamber. Today, approximately fifty percent of the wet processing stations on a wafer plating tool are dedicated to plating, having a significant negative impact on wafer throughput and increasing processing cost. In addition, to enable direct copper plating on the barrier layer, minimizing time between surface activation and plating is critical. The additional time, to rinse after surface activation and to transport the wafer to the plating module, significantly limits the effectiveness of the surface activation step. What is needed is a way of eliminating DI water rinses between wet processing steps.

During the plating process, the wafer acts as a cathode, which requires that the power supply be electrically connected to the wafer. Typically, numerous discrete contacts on the wafer holder connect the wafer holder electrically to the edge of the wafer. The current utilized to electroplate the wafers is provided through these contacts. Plating current must be evenly distributed around the perimeter of the wafer to provide uniform deposition. Maintaining consistent contact resistance with the wafer, through the resistive seed layer, is critical for uniform deposition. Therefore, in an effort to provide uniform deposition, cleanliness of the contacts is preferred. In some cases, cleaning of the contacts requires additional steps further limiting the productivity of the plating operation.

Another challenge in copper electroplating is a bipolar effect, observed when the contact resistance is very high. This effect induces etching of the copper seed layer directly under the contacts, thereby severing as the electrical contact between the wafer and the power supply during electroplating. Prior art approaches have attempted to resolve this issue by sealing the contacts from the electrolyte, thereby preventing plating on the contacts and eliminating the bipolar effect. Unfortunately, seals are not perfect and contacts become contaminated and current distribution in the contacts along the wafer periphery results in non-uniform plating. Consequently, contact resistance must be controlled by some other way of active monitoring during the plating process.

Additional adverse physical challenges occur when applying the contacts to the surface of the wafer. While the contacts are typically placed in the exclusion area (e.g., a 1–3 mm outer region of the wafer) of the wafer, some amount of force must be applied to maintain consistent electrical contact with the wafer. Application of such force can, in some cases cause defects on the wafer due to mechanical stresses on certain materials, such as porous low-k dielectric films.

As feature dimensions on semiconductor wafers continue to shrink, the copper seed layer thickness is also expected to decrease, from approximately 1000 angstroms today to less than about 400 angstroms. Thickness reduction of the seed layer is necessary to ensure a reasonable sized opening at the top of the features so as to enable void free gap fill during the copper electroplating process. Since the role of the seed layer is to distribute the plating current over the entire wafer during electroplating, a thinner more resistive seed layer introduces a significant challenge in chambers designed for uniform plating near contacts on the wafer periphery. Known as the terminal effect, this effect is more pronounced on larger wafers, such as today's 300 mm wafers.

What is needed therefore, is an electroplating system that limits rinsing processes and provides sufficient electrical contact without applying excessive surface force while producing uniform electroplating on wafers with little or no seed layer.

SUMMARY OF THE INVENTION

Broadly speaking, the present invention is an apparatus that provides local electroplating using a meniscus based plating process. In the claimed invention, the plating and planarization process proceeds on either the entire wafer surface, or in the case of sub-aperture plating, a plating head of smaller size than the wafer scans the wafer and provides localized plating.

It should be appreciated that the present invention can be implemented in numerous ways, including as a process, an apparatus, a system, a device or a method. Several inventive embodiments of the present invention are described below.

In one embodiment, an electroplating apparatus for electroplating a surface of a wafer is provided. The surface of the wafer is capable of being electrically charged as a cathode. A proximity head capable of being electrically charged as an anode is included. The proximity head has a plurality of inputs and a plurality of outputs, and when the proximity head is placed close to the surface of the wafer, each of the plurality of inputs is capable of delivering a fluid to the surface of the wafer and each of the plurality of outputs is capable of removing the fluids from the surface of the wafer. The delivery and removal of fluids to and from the surface of the wafer enables localized metallic plating when the wafer and proximity head are charged.

In another embodiment of the present invention, a first fluid electrically charged as an anode is generated between a first proximity head and the surface of the wafer for depositing a metallic layer. A second fluid electrically charged as a cathode for enabling a non-consumable chemical reaction over the surface of the wafer is capable of being generated between a second proximity head and the surface of the wafer. An electrical connection is defined between the first fluid and the second fluid when depositing the metallic layer over the surface of the wafer.

In yet another embodiment of the present invention, a first fluid electrically charged as an anode is generated between a first proximity head and the surface of the wafer for depositing a metallic layer. A second fluid electrically charged as a cathode for enabling a non-consumable chemical reaction over the surface of the wafer is capable of being generated between a second proximity head and the surface of the wafer. An electrical connection is defined between the first fluid and the second fluid when depositing the metallic layer over the surface of the wafer. The second proximity head is placed in physical contact with the deposited layer by way of a pad to enable removal of at least a portion of the metal layer.

The advantages of the present invention are numerous, most notably; the embodiments enable localized plating thereby reducing the active area of plating and improving chemical exchange. Localized metallic plating reduces the total plating current that must be distributed over the seed layer, thereby significantly reducing the resistive seed layer effect and improving deposit uniformity. In-situ film thickness control and planarization produce increased productivity by reducing the number of wafer transfers during processing, and consolidating several applications on one piece of equipment. Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention, for methods and apparatuses for electroplating surfaces of a substrate, is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1A:
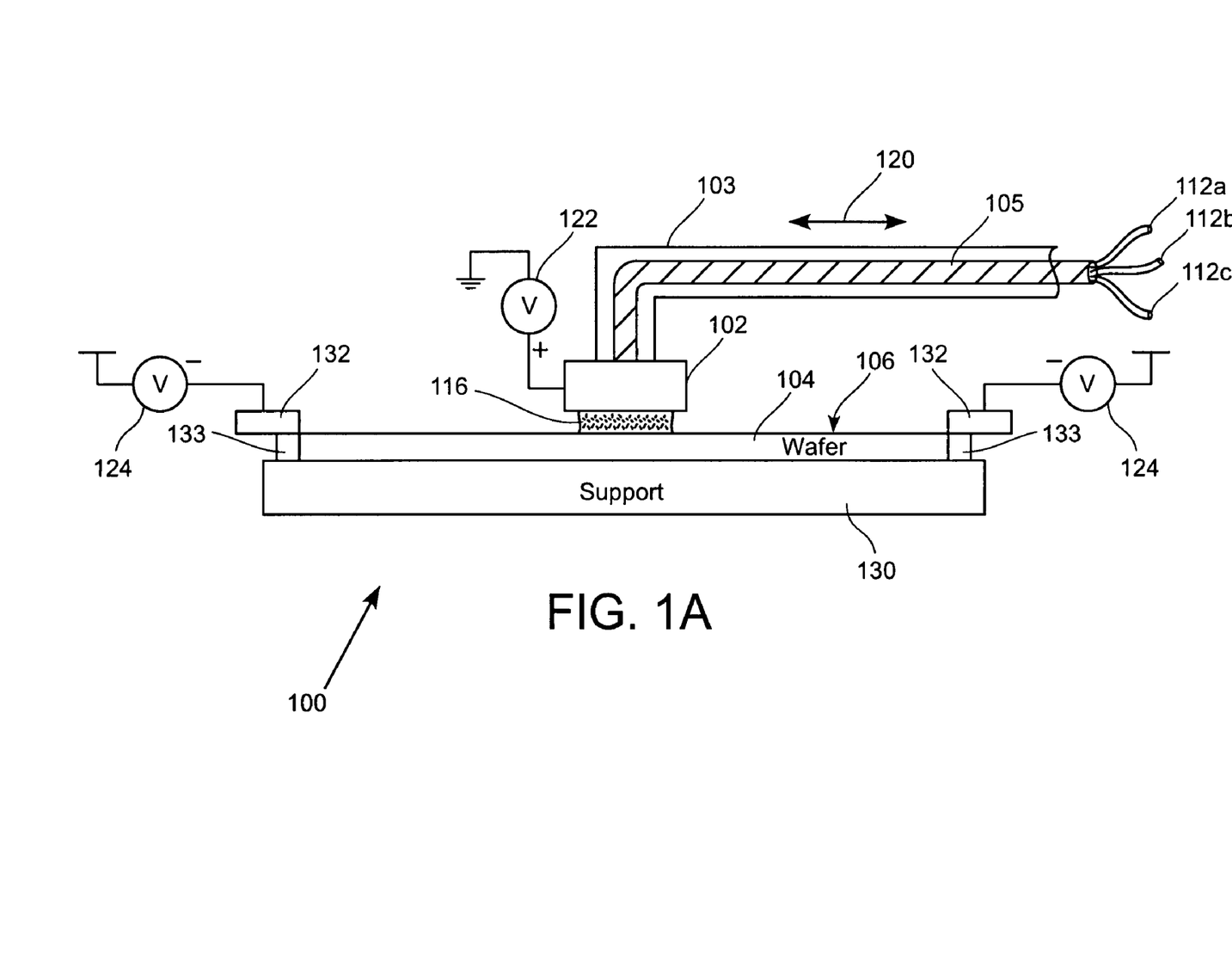
FIG. 1A illustrates an electroplating apparatus.

FIG. 1A is a drawing of an exemplary electroplating apparatus 100 in accordance with one embodiment of the present invention. A wafer 104 with a seed layer 106 is placed on a support 130. A negative bias power supply 124 charges the wafer 104 to function as a cathode by way of electrical contact 132. Electrical contact 132 may be established in the form of a single ring surrounding the wafer 104, an individual mechanical contact, or a plurality of individual contacts. In a preferred embodiment, the electrical contact 132 is applied to a periphery of the wafer 104, such that contact is made with an edge exclusion region 133. The edge exclusion region 133 is typically between 1 to 3 mm, for 200 and 300 mm wafers.

A proximity head 102 charged as an anode by a positive power supply 122 is suspended above the wafer 104 by an arm 103. The arm 103 can contain a conduit channel 105 for holding one or more conduits for delivery and removal of fluids utilized in the electroplating operation. Of course, the conduit channel 105 can be coupled to the proximity head 102 by any other suitable technique, such as strapped to the arm 103, etc. In one embodiment, the arm 103 is part of system that facilitates movement of the proximity head 102 across the wafer 104 in a direction 120.

Movement of the proximity head 102 can be programmed to scan the wafer 104 in any number of ways. It should be appreciated that the system is exemplary, and that any other suitable type of configuration that would enable movement of the head(s) into close proximity to the wafer may be utilized. For example, when the wafer is rotated, the proximity head 102 can start at the center of the wafer 104 and progressively move linearly to the outer edge. In another embodiment, the proximity head 102 could navigate a fixed wafer while circling in an orbital fashion or otherwise move over the wafer in a fashion that enables processing of all portions of the wafer. In another embodiment, the proximity head 102 may scan the wafer using reciprocating movement, move in a linear fashion from one edge of the wafer to another diametrically opposite edge of the wafer, or other non-linear movements may be utilized such as, for example, in a radial motion, in a circular motion, in a spiral motion, in a zigzag motion, etc. The motion may also be any suitable specified motion profile as desired by a user. During this movement, it is desired that the plating operation deliver a uniform layer of metallic material to the surface of the wafer 104. Details regarding the functionality of the proximity head 102 and the plating techniques will be described in greater detail below.

Figure 1B:
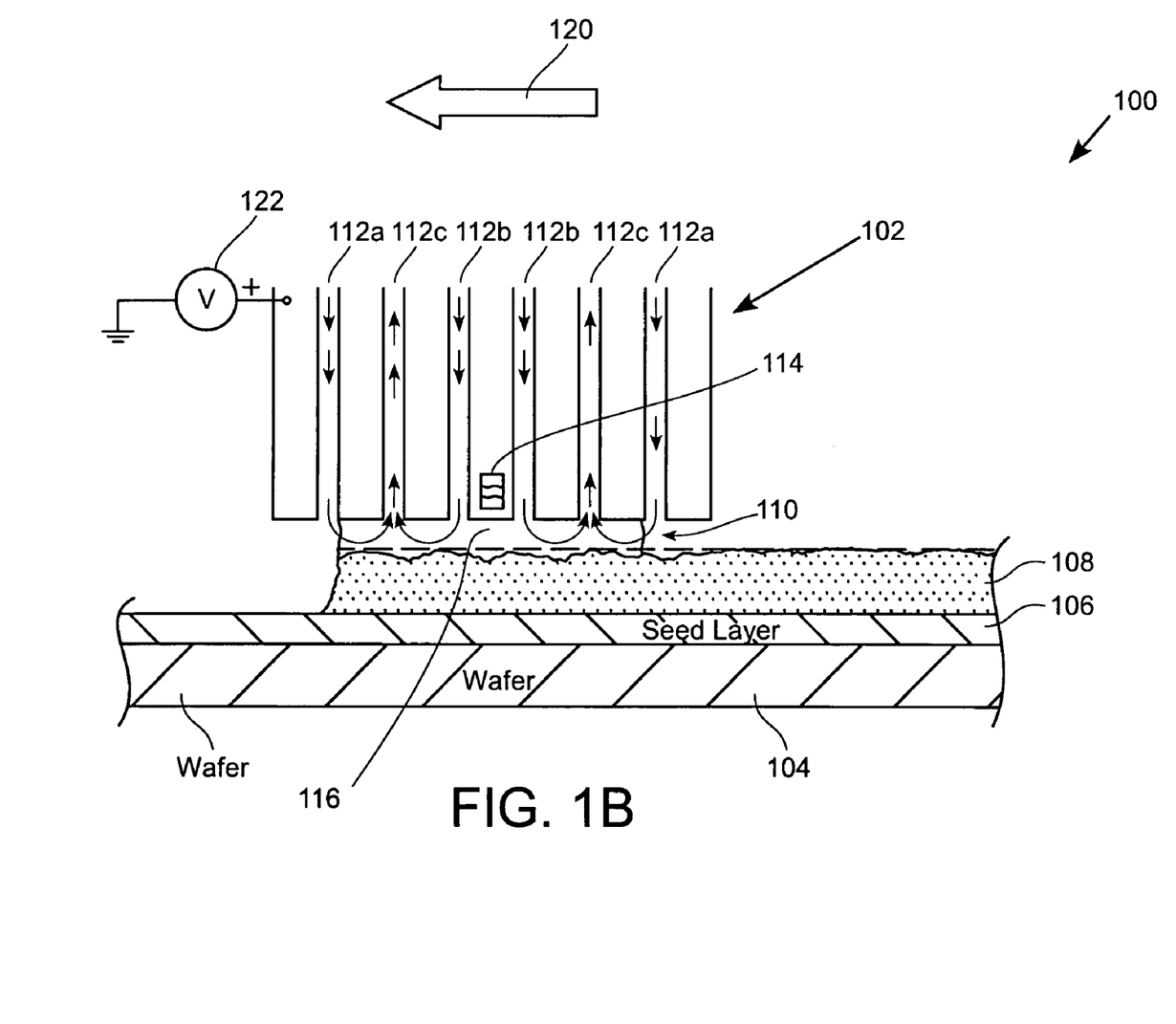
FIG. 1B illustrates an electroplating apparatus shown during localized metallic plating.

Localized metallic plating of the electroplating apparatus is shown in FIG. 1B. As used herein, localized metallic plating is meant to define an area beneath the proximity head 102 where a metallic material is deposited. As shown in the drawings, the area beneath the proximity head 102 is less than the surface area of the wafer 104. Thus, localized metallic plating will occur only under the proximity head 102 at a given point in time. To accomplish more metallic plating over the surface of the wafer 104, the proximity head 102 will need to move over another surface area of the wafer 104. In exemplary embodiments, the proximity head 102 will be coupled to an arm 103 as shown in FIG. 1A. Although any number of movement patterns can be used to ensure that the desired areas of the wafer 104 are adequately plated with a particular metallic material, one way is to move the arm 103 while the wafer 104 is rotated in a controlled environment. In addition, an arm 103 is only one exemplary way of moving the proximity head 102. For instance, the wafer 104 can be moved instead of moving the proximity head 102.

Returning to FIG. 1B, the proximity head 102 is placed over the wafer 104 having a seed layer 106. The seed layer 106 is optional, however, some embodiments may benefit from having the seed layer 106 formed thereon before an electroplating operation is performed. When copper is the material being plated, the seed layer is typically a thin layer of copper that may be sputtered or deposited using known techniques. Thereafter, a deposited layer 108 is formed over the seed layer 106 as the proximity head 102 proceeds in a direction 120 across the wafer 104. The deposited layer 108 is formed by way of an electrochemical reaction facilitated by an electrolyte 110 contained in a meniscus 116 that is defined between the proximity head 102 and the seed layer 106. In an alternative embodiment, the deposited layer 108 can be formed over a layer that is not a seed layer. An example of such layer may be a barrier layer or some other layer material.

Figure 1C:
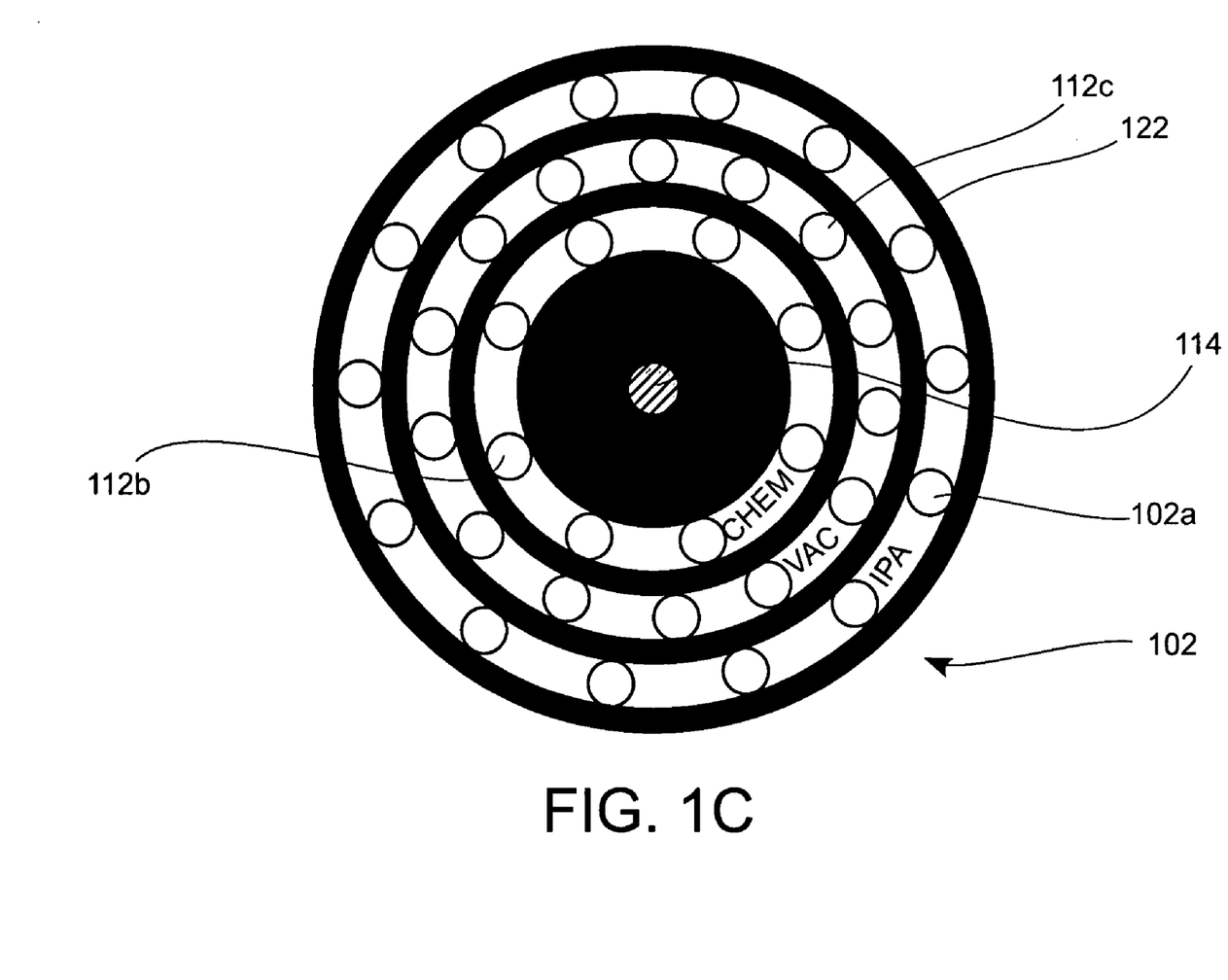
FIG. 1C provides a bottom view of a proximity head of the electroplating apparatus.

FIG. 1C illustrates a generic bottom view of the proximity head 102, in accordance with one embodiment of the present invention. The proximity head 102 has a plurality of inputs 112*a* and 112*b* and outputs 112*c*. The plurality of inputs 112*a* and 112*b*, and the plurality of outputs 112*c* can be defined by one or more individual conduits. Each conduit can be machined or form-made during the manufacture of the proximity head 102 body. In another embodiment, the plurality of inputs 112*a* and 112*b* and outputs 112*c* can be defined by annular rings that enable fluids to be transported in a similar way as would the conduits. The selection of the particular structure for the plurality of inputs 112*a* and 112*b* and outputs 112*c*, as will be appreciated by those skilled in the art, can take on many physical forms and shapes. However, it is important for the selected form or shape to be able to functionally deliver fluids by way of inputs and remove fluids by way of outputs. Consequently, in one embodiment, the wafer 104 remains dry in all regions except for in regions below the proximity head 102.

As shown, a plating chemistry is supplied by way of the plurality of inputs 112*b* that enable localized metallic plating beneath the proximity head 102. Plating chemistry may be designed for deposition of copper, however other plating chemistries may be substituted depending on the particular application (i.e., the type of metallic material needed). The plating chemistry could be defined by an aqueous solution for depositing metals, alloys, or composite metallic materials. In one embodiment, deposited metals can include, but not limited to, one of a copper material, a nickel material, a thallium material, a tantalum material, a titanium material, a tungsten material, a cobalt material, an alloy material, a composite metallic material, etc.

The plating chemistry is preferably confined in a meniscus 116 that is defined as a thin layer of fluid lying over the seed layer 106 beneath the proximity head 102. To further confine and define the meniscus 116, an isopropyl alcohol (IPA) vapor supplied by way of the plurality of inputs 112*a*. The thickness of the meniscus 116 may vary based on the desired application. In one example, the thickness of the meniscus may range between about 0.1 mm and about 10 mm. Thus, the proximity head 102 is placed close to the wafer surface. As used herein, the term "close" defines a separation between the undersurface of the proximity head 102 and the surface of the wafer 104, and that separation should be sufficient to enable the formation of a fluid meniscus. A plurality of outputs 112*c* provide vacuum to remove the fluid byproducts of the plating reaction delivered by the plurality of inputs 112*b* and 112*a*.

In accordance with the invention, the deposited plating material is formed by a chemical reaction taking place in an electrolyte 110 supplied by the plurality of inputs 112*b*. Charging the proximity head 102 as an anode facilitates the chemical reaction. In one example, the proximity head is electrically coupled to a positive bias voltage supply 122. To enable the plating, a reduction of ions in the chemistry is performed at the seed layer 106, which is charged as a cathode through the electrical contact 132 to the negative bias power supply 124. The chemical reaction causes a metallic layer to be formed as deposited layer 108. Reaction byproducts and depleted reactant fluids are removed via the plurality of outputs 112*c*.

In another embodiment, an eddy current sensor 114 is integrated into the proximity head 102. The eddy current sensor 114 is used to determine the presence and thickness of a metallic layer and to determine when a particular process is complete (e.g., end pointing). In one embodiment, the thickness of the deposited layer 108 can be sensed during the deposition process. In this manner, controlled application of metallic materials can be attained. Of course, other techniques for measuring the thickness of the deposited layer 108 can be used. For a more detailed description of the functionality of eddy current sensors, reference can be made to U.S. patent application Ser. No. 10/186,472, entitled "Integration of Sensor Based Metrology into Semiconductor Processing Tools", filed on Jun. 28, 2002, and which is incorporated herein by reference.

Figure 1D:
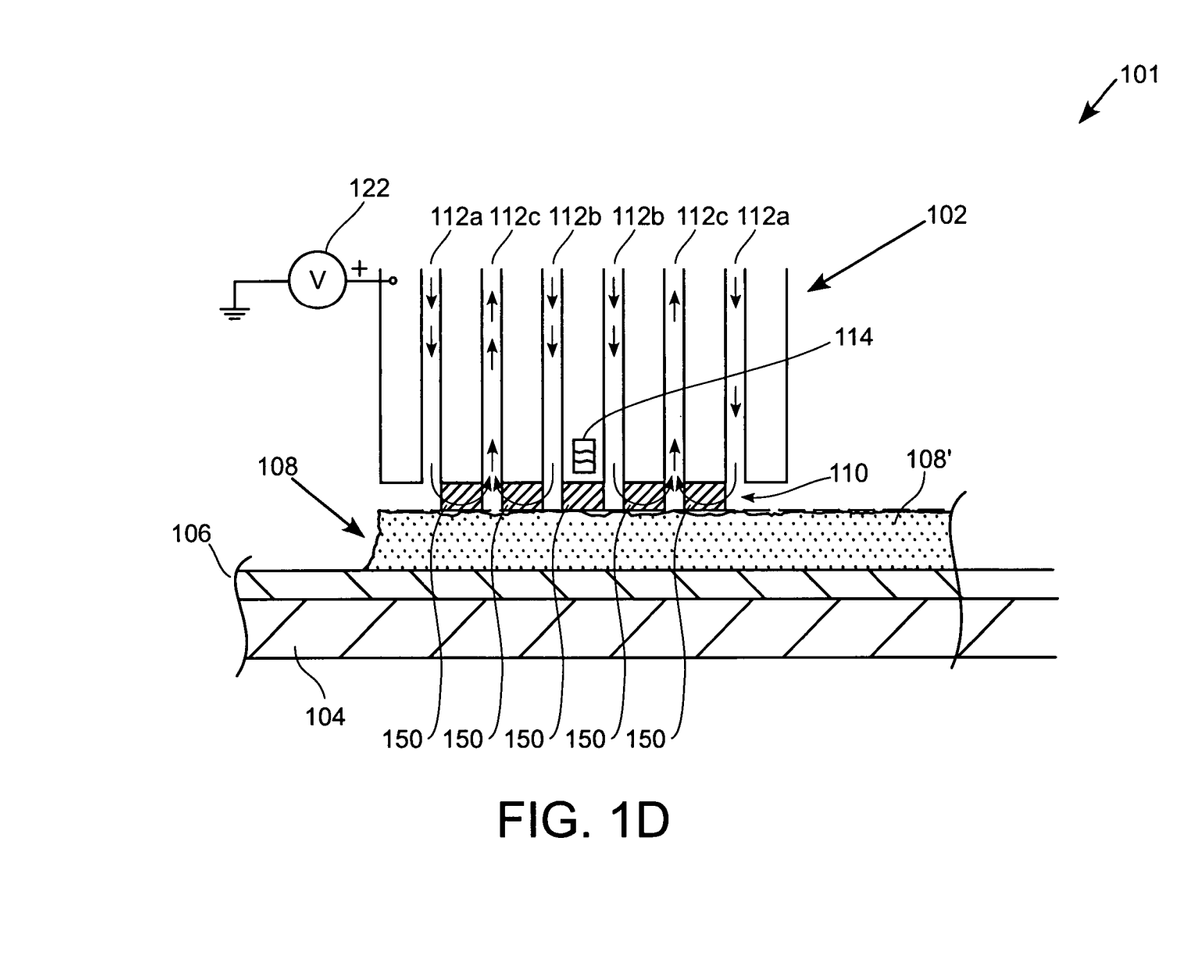
FIG. 1D illustrates a prospective view of an electroplating apparatus equipped with a polishing pad for planarization.

FIG. 1D illustrates, in accordance with another embodiment, an electroplating and polishing system 101. In this embodiment, the proximity head 102 has been equipped with a polishing pad 150, which assists by planarizing the deposited layer 108. An abrasive-free reactive chemical supplied by the plurality of inputs 112*a* and 112*b* is applied to the polishing pad 150 facilitating a planarized layer 108'. The polishing pad 150 can be made from any number of materials, so long as channels in the pad material allow passage of chemical fluids. In one example, the material can be porous polymer material, similar to those materials commonly used in chemical mechanical polishing (CMP) equipment. Other materials can include, for example, polyurethane compounds, fixed abrasive materials such as MWR64 or MWR69 from 3M, of Minneapolis Minn., etc. In one exemplary operation, a deposition of metallic material will occur almost simultaneously with the polishing operation that is facilitated by the polishing pad 150. In another embodiment, the polishing can be performed using the same proximity head 102 used to deposit metallic material. In another embodiment, the plating head and polishing head can be independent workpieces, with the polishing head trailing the plating head. However, polishing can occur at a later point in time after deposition is completed. As can be appreciated, the actual combination of deposition and polishing operations can be selected depending on the desired application. By alternating plating and planarization steps or by performing simultaneous plating and planarization, topographic variation and undesired overburden material is removed.

Figure 2A:
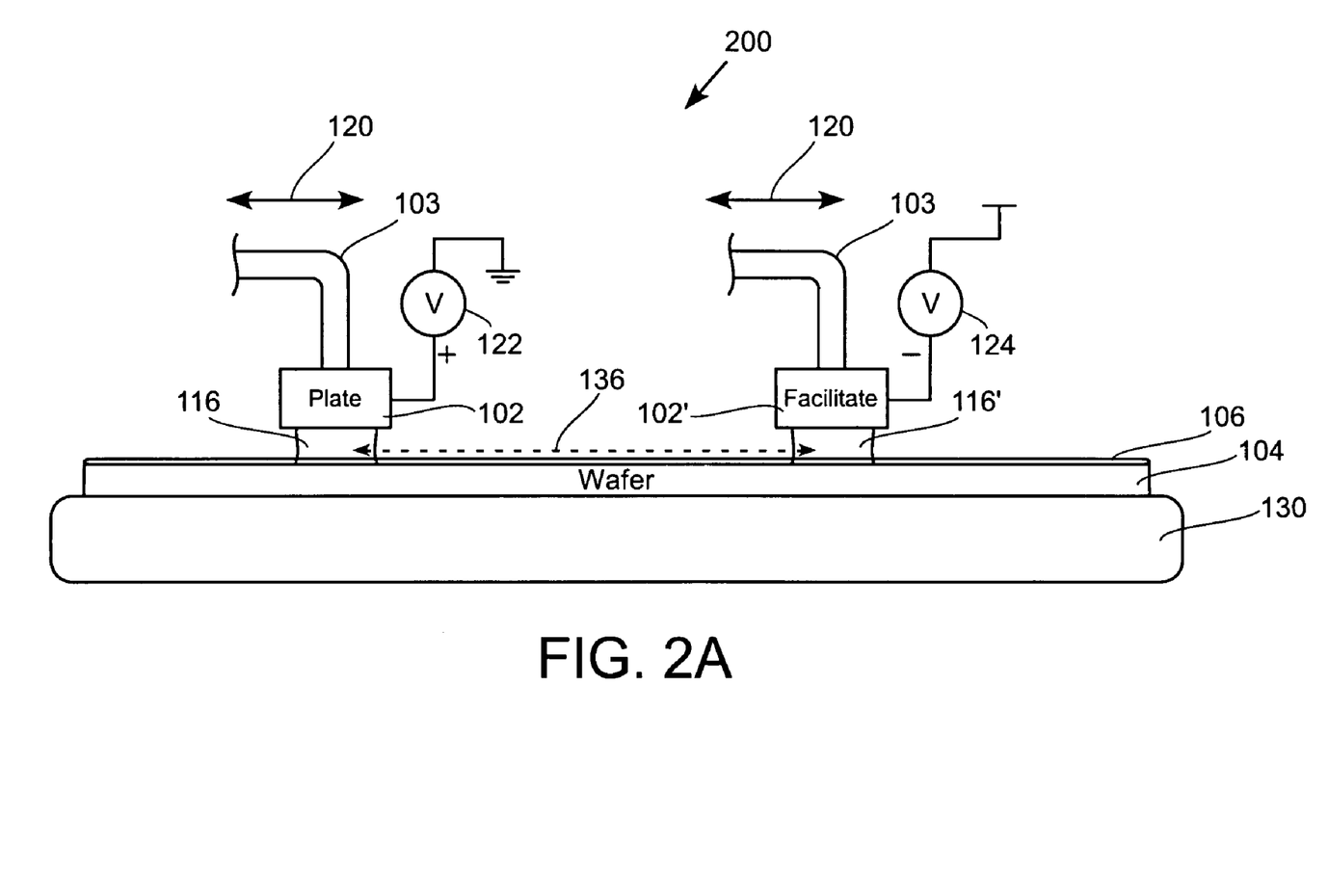
FIG. 2A illustrates an electroplating apparatus without mechanical contacts to a wafer.

FIG. 2A is an illustration of an exemplary contact-less electroplating apparatus 200 in accordance with one embodiment of the present invention. A contact-less electroplating apparatus as used herein is an apparatus that utilizes electrolytic contact. In this embodiment, the proximity head 102 is supported in a close relationship to the wafer 104 by the arm 103 so as to create the meniscus 116. In this illustration, the seed layer 106 is exposed to the meniscus 116 while the wafer 104 is held on the support 130, as described above. The proximity head 102 is charged electrically to perform as an anode by connecting to the positive power supply 122. Additionally, a second proximity head 102' is supported by an arm 103, and acts as a facilitator to enable plating by the proximity head 102, while at the same time not removing material from the surface of the wafer 104. The arm 103 could be an extension of the arm holding the proximity head 102 or a separate arm. In this alternative embodiment, the second proximity head 102' is charged as a cathode by a negative bias power supply 124. A meniscus 116' is defined between the second proximity head 102' and the seed layer 106. The facilitating enabled by the meniscus 116' is a result of the chemistry that defines the meniscus 116' itself. Exemplary chemical characteristics of the meniscus 116' are provided below.

Figure 2B:
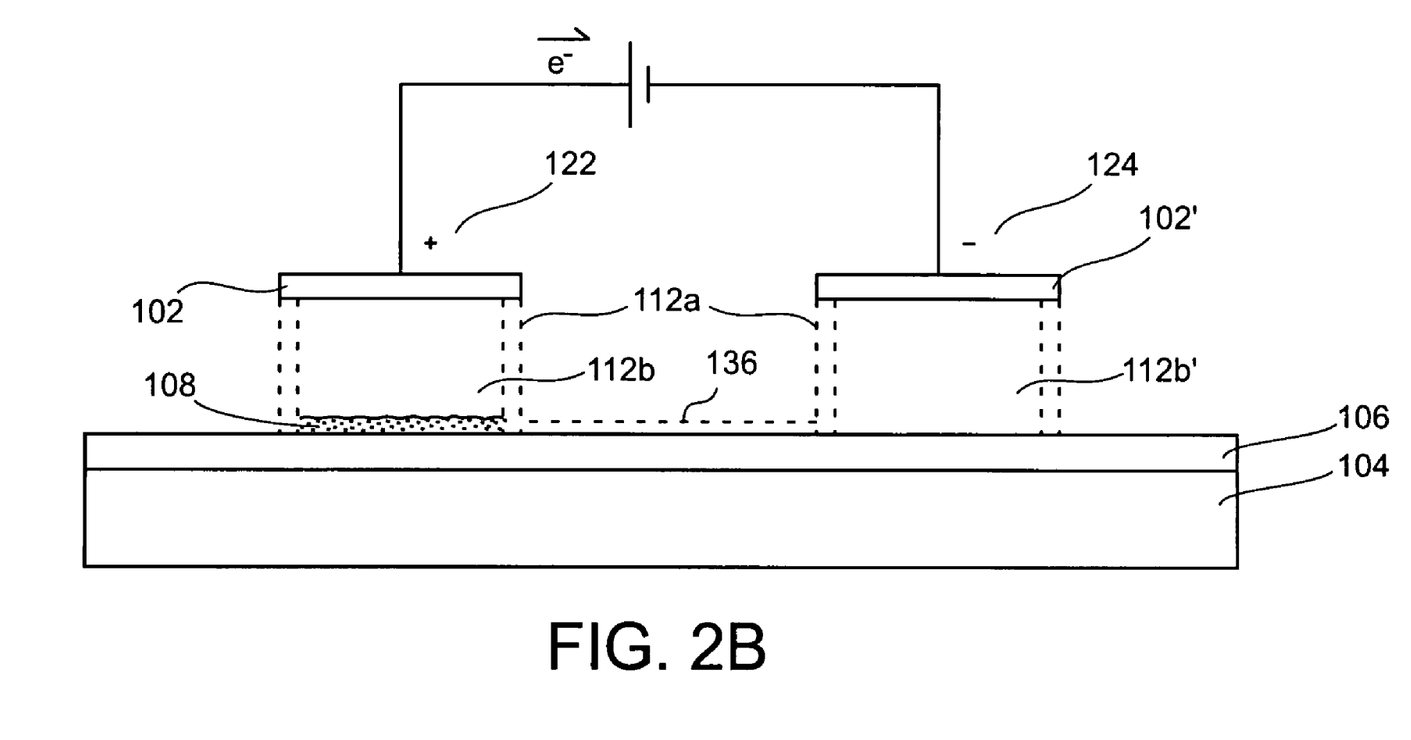
FIG. 2B illustrates an electrolytic reaction used by the electroplating apparatus without mechanical contacts to the wafer for an electroplating operation.

FIG. 2B illustrates an exemplary electrolytic reaction used by the contact-less electroplating apparatus 200 for metallic plating of the deposited layer 108. As previously discussed, beneath the proximity head 102, the meniscus 116 contains an electrolytic plating chemistry that is charged by the anode through the positive bias voltage supply 122.

Figure 2C:
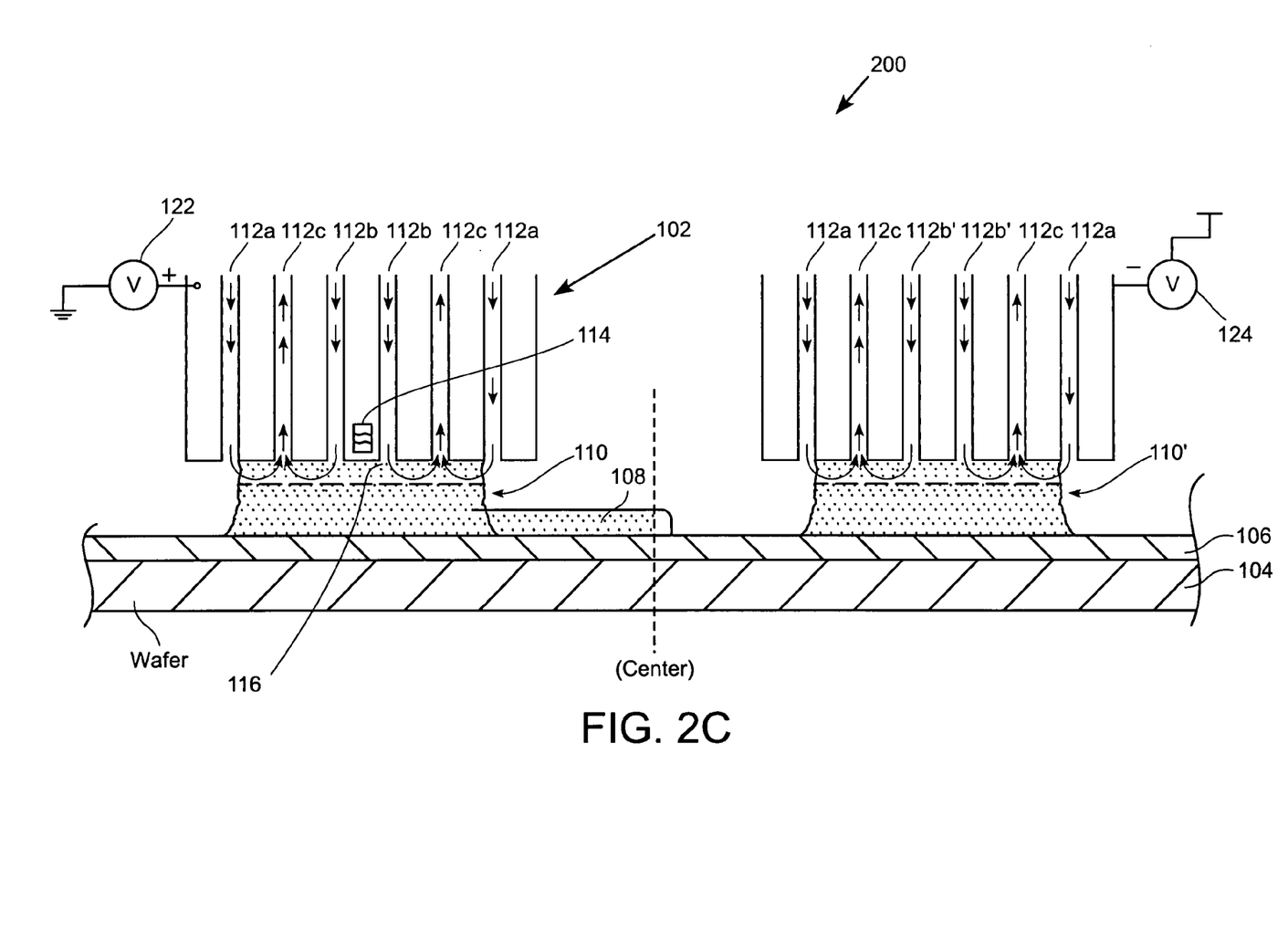
FIG. 2C provides a cross sectional view of the electroplating apparatus without mechanical contacts, showing an electroplating head and a second head at an interface of the wafer surface.

The meniscus 116 includes IPA vapor supplied by way of the plurality of inputs 112a and an electrolyte 110 plating chemistry supplied by way of the plurality of inputs 112b, as shown in FIG. 2C. In an exemplary embodiment, the plurality of inputs 112b beneath the proximity head 102 provides an electrolytic solution whereby the reaction at the surface of the wafer 104 is $Cu^{+2}+2e^- \rightarrow Cu$ when the proximity head 102 has been charged a positive bias voltage supply 122. As this is a REDOX reaction, the reaction away from the wafer 102 surface is $Cu \rightarrow Cu^{+2}+2e^-$ if a consumable Cu electrode is used, or $2H_2O \rightarrow O_2+2e^-$ if a non-consumable electrode is used.

Similarly the second proximity head 102', which serves as the counter electrode is charged by the negative bias voltage supply 124. A second meniscus 116' formed beneath the second proximity head 102' contains electrolytic chemistry. The second meniscus 116' includes IPA vapor supplied by way of the plurality of inputs 112a and an electrolyte 110' as supplied through the plurality of inputs 112b'. In an exemplary embodiment, the plurality of inputs 112b', provide an electrolytic solution at the second proximity head 102' whereby the reaction at the surface of the wafer 104 is of the form $Me^x$ [complex]$\rightarrow Me^{x+1}$ [complex]$+e^-$. In this case, Me can be a metal ion such as Cu, and x is 2. The complexing agent can be ethylene diamine or ammonia ($NH3$). The reaction away from the surface of the wafer 104 can be the reverse, for example $\rightarrow Me^{x+1}$ [complex]$+e^- \rightarrow Me^x$ [complex]. Other chemistries may provide a similar function; the chemistry is selected such that the counter electrode chemistry is at a lower potential than the $Cu \rightarrow Cu^{+2}+2e^-$ potential, thus suppressing the dissolution of Cu at the counter electrode. Additionally, the electrolyte 110' beneath the second proximity head 102' can be tailored with other additives, such as ethylene glycol, to assist in the suppression of Cu dissolution. An electrical connection 136 is established between the proximity head 102 and the second proximity head 102' through the seed layer 106. Through this electrical connection 136, the electrolyte 110 and the electrolyte 110' will be connected completing the REDOX couple and enabling plating by the proximity head 102. It is important to note that the second proximity head 102' provides the link to a cathode (i.e., negative bias voltage supply), and thus, no physical contact with the wafer 104 is needed. The combination of the proximity head 102 and the second proximity head 102' defines a contact-less connection to the wafer 104 providing more efficient and uniform plating of desired metallic materials.

Figure 2D:
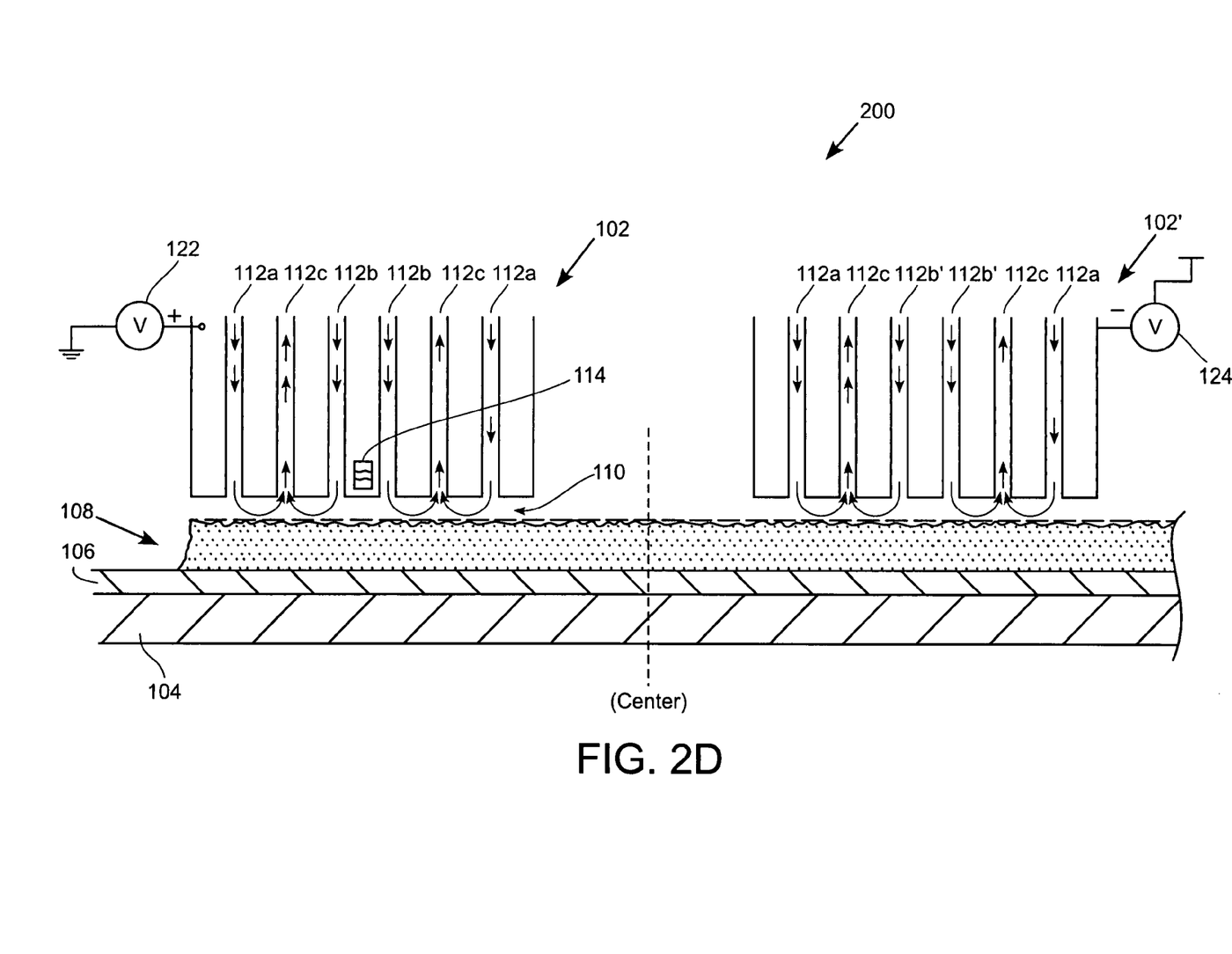
FIG. 2D provides a cross sectional view of the electroplating apparatus without mechanical contacts, showing the progression of the deposited layer as a electroplating head and a second head are applied over the surface of the wafer.

In another embodiment, an eddy current sensor 114 is integrated into the proximity head 102. The eddy current sensor 114 is used to determine the presence and thickness of a metallic layer and to determine when a particular process is complete. In one embodiment, the thickness of the deposited layer 108 can be sensed by the eddy current sensor 114 during the deposition process. In this manner, controlled application of metallic materials can be attained. FIG. 2D shows the progression as the deposited layer 108 is applied over the surface of the wafer 104, where the second proximity head 102' is now sitting over the deposited layer 108.

Figure 3:
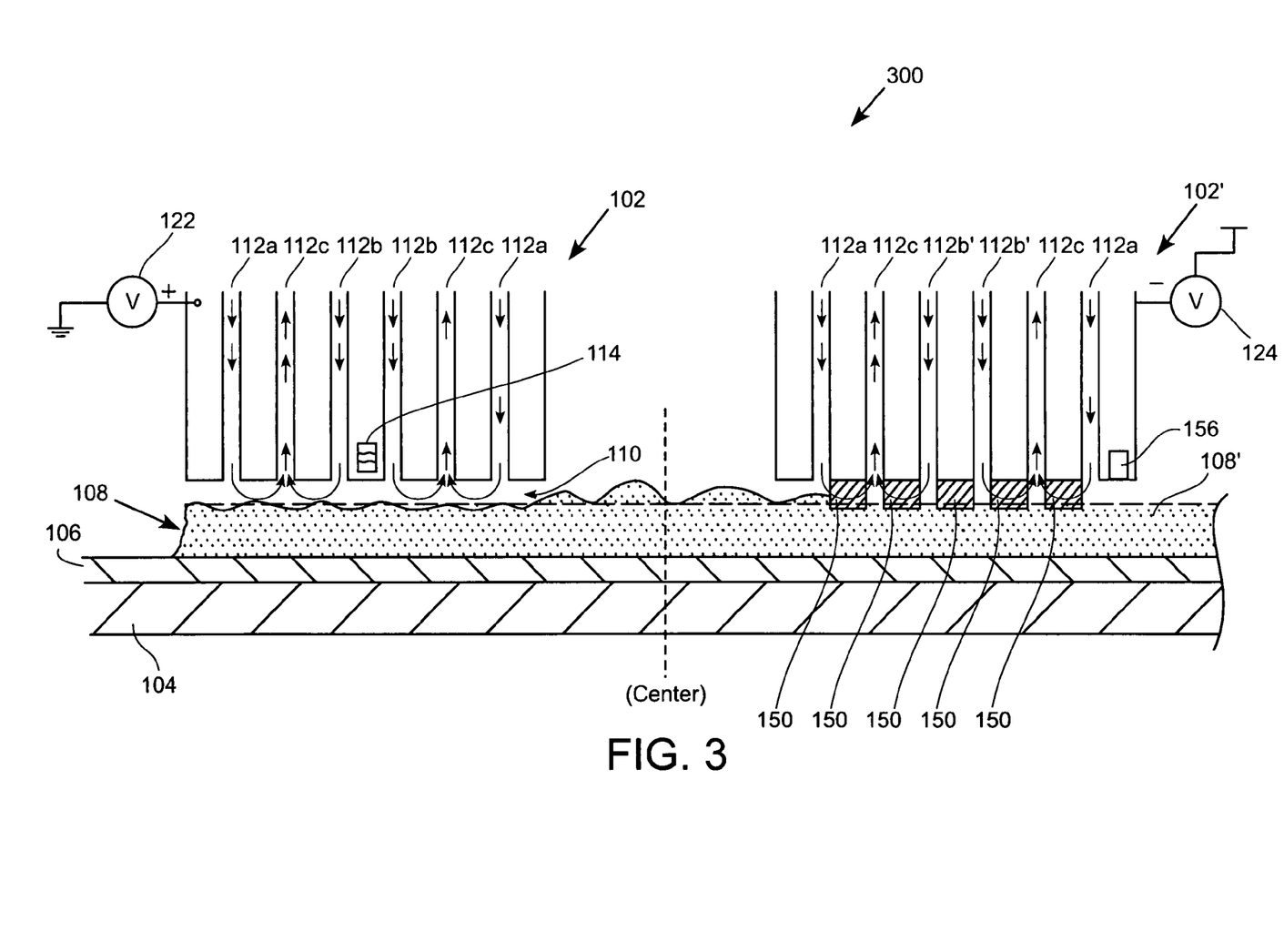
FIG. 3 provides a cross sectional view of an electroplating and planarization apparatus, showing the electroplating and electrolytic heads at the interface with the wafer surface, where the second head is equipped with a polishing pad for planarization.

FIG. 3 illustrates an electroplating and planarizing apparatus 300 in accordance with one embodiment of the present invention. The proximity head 102 operates in the manner previously discussed. The second head 102' provides an electrical path for the plating operation as described above. Additionally, in this embodiment the second head 102' is equipped with a polishing pad 150. The polishing pad 150 provides for leveling of the deposited layer 108 resulting in a planarized layer 108'. The presence of the polishing pad 150 does not inhibit electrical connectivity 136 of the second head 102'. An abrasive-free reactive chemical may also be delivered by way of the plurality of inputs 112a and 112b' to assist in the leveling process. The planarized layer 108' can be achieved under the second proximity head 102' simultaneously to the deposition process beneath the proximity head 102.

In another embodiment, planarization is accomplished beneath a third head that operates independently of the first proximity head 102 and second proximity head 102'. Fluid delivered via meniscus formation and confinement with IPA can be of an abrasive-free chemistry that facilitates planarization in concert with a polishing pad integrated on the head.

In another embodiment a second proximity head 102' with a polishing pad 150 is equipped with a scatterometer system 156, which provides planarization control by way of sensing backscatter parameters from the topography of the deposited layer 108.

Figure 4:
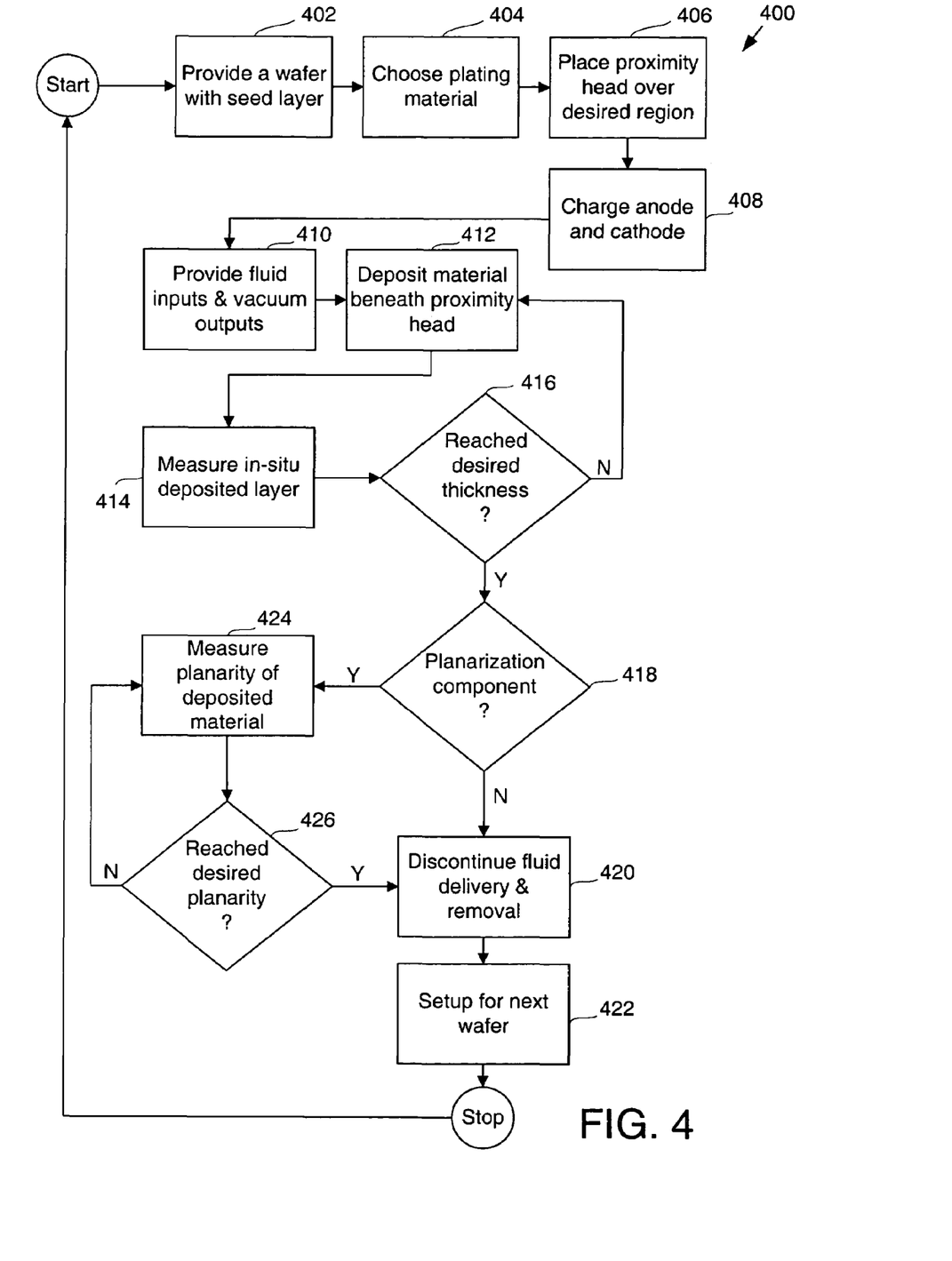
FIG. 4 is a flowchart for operation of the electroplating apparatus.

FIG. 4 is a flow chart diagram that provides an exemplary method of operation for an electroplating and planarizing apparatus 400 in accordance with the present invention. Given the electroplating apparatus as described in FIGS. 1–3 above, an operator must provide a wafer with a seed layer 402. In an alternative embodiment, the wafer may not have a seed layer yet formed thereon. The wafer may be transported to the wafer support in a number of ways. Wafer transport may include a series of manual or automated robotic movements assisted by mechanical, vacuum, electrostatic or other ways of holding the wafer. Once the wafer is placed on the support the operator must select the material desired for deposition 404. Next the proximity head is placed over the desired deposition region 406. Placement of the proximity head may be predefined and facilitated by an automated routine. A voltage bias may be applied to the proximity head responsible for deposition 408 at any time prior to deposition including during the wafer and arm movements or when the fluid is provided through the plurality of inputs described above. Once the proximity has a bias voltage applied, the selected fluid inputs and vacuum outputs are applied 410 beneath the proximity head and the material is deposited 412.

In-situ measurement of the deposited layer 414 ensures that the desired thickness is achieved 416. The proximity head will remain in its current position until the desired thickness is achieved by way of the feedback provided from the in-situ measurement system 414. In one embodiment the measurement system may be one of the eddy current sensor system described above. Of course, other thickness measuring techniques may also be used. Once desired deposition thickness is achieved, the proximity head responsible for deposition will discontinue fluid delivery and removal 420. The system will then be setup for the next wafer 422. In one embodiment the proximity head is removed from the plane of the wafer while in other embodiments the wafer itself may be transported while the head remains above the wafer. Once the wafer is removed another wafer may be placed on the support for subsequent deposition.

If the system is equipped with a planarization component as described in FIG. 1D and FIG. 3 above, the deposited material will be leveled to assist uniform deposition across the desired area. In-situ measurement techniques may be used to ensure that the deposited layer is planarized 424. When the sufficient planarity is achieved, the fluid delivery and removal system can be discontinued 420 and the system can be setup for the next wafer 422. In one embodiment, the proximity heads are removed from the plane of the wafer, while in other embodiments, the wafer itself may be transported while the heads remain above the wafer. Once the wafer is removed, another wafer may be placed on the support for subsequent deposition and planarization.

While this invention has been described in terms of several preferred embodiments, it will be appreciated that those skilled in the art upon reading the preceding specifications and studying the drawings will realize various alterations, additions, permutations and equivalents thereof. For instance, the electroplating system described herein may be utilized on any shape and size of substrates such as for example, 200 mm wafers, 300 mm wafers, flat panels, etc. It is therefore intended that the present invention includes all such alterations, additions, permutations, and equivalents as fall within the true spirit and scope of the claimed invention.

What is claimed is:

1. An electroplating apparatus for electroplating a surface of a wafer, comprising:
   a first proximity head configured to be placed over the surface of the wafer, a first fluid electrically charged as an anode for depositing a metallic layer over the surface of the wafer is capable of being generated between the proximity head and the surface of the wafer; and
   a second proximity head configured to be placed over the surface of the wafer, a second fluid electrically charged as a cathode for enabling a non-consumable chemical reaction over the surface of the wafer is capable of being generated between the proximity head and the surface of the wafer, wherein an electrical connection is defined between the first fluid and the second fluid when depositing the metallic layer over the surface of the wafer.

2. An electroplating apparatus for electroplating a surface of a wafer as recited in claim 1, wherein the first fluid provides electrical coupling to the substrate through electrolytic properties of the first fluid that is charged as the anode through electrical contact with a positive bias voltage supply.

3. An electroplating apparatus for electroplating a surface of a wafer as recited in claim 1, wherein the second fluid provides electrical coupling to the substrate through electrolytic properties of the second fluid that is charged as the cathode through electrical contact with a negative bias voltage supply.

4. An electroplating apparatus for electroplating a surface of a wafer as recited in claim 1, wherein beneath the second proximity head a non-consumable chemical reaction prevents dissolution of the metallic layer by producing an offsetting reaction.

5. An electroplating apparatus for electroplating a surface of a wafer as recited in claim 4, wherein the non-consumable chemical reaction is an offsetting reaction produced by a reduction of oxidation process.

6. An electroplating apparatus for electroplating a surface of a wafer as recited in claim 1, wherein each of the plurality of inputs on the first proximity head and the second proximity head are defined as one of circular conduits, annular rings, and discrete conduits.

7. An electroplating apparatus for electroplating a surface of a wafer as recited in claim 1, wherein each of the plurality of outputs on the first proximity head and the second proximity head are defined as one of circular conduits, annular rings, and discrete conduits.

8. An electroplating apparatus for electroplating a surface of a wafer as recited in claim 1, wherein the fluid beneath the first proximity head is defined by one or more fluids and the fluids are selected from the group comprised of isopropyl alcohol (IPA), electrolytic solution, and a plating chemistry that enables metallic plating.

9. An electroplating apparatus for electroplating a surface of a wafer as recited in claim 8, wherein the plating chemistry is defined by an aqueous solution for depositing metals including one of a copper material, a nickel material, a thallium material, a tantalum material, a titanium material, a tungsten material, a cobalt material, an alloy material, and a composite metallic material.

10. An electroplating apparatus for electroplating a surface of a wafer as recited in claim 1, wherein the fluid beneath the second proximity head is defined by one or more fluids and the fluids are selected from the group comprised of isopropyl alcohol (IPA), electrolytic solution, and water.

11. An electroplating apparatus for electroplating a surface of a wafer as recited in claim 1, wherein the localized metallic plating confines a volume of the fluid within an area beneath the first proximity head, the area being less than an entirety of the wafer surface.

12. An electroplating apparatus for electroplating a surface of a wafer as recited in claim 1, wherein an eddy current sensor enables monitoring of the localized metallic plating beneath the first proximity head.

* * * * *